(12) United States Patent
Sakumoto

(10) Patent No.: US 11,410,903 B2
(45) Date of Patent: Aug. 9, 2022

(54) SEMICONDUCTOR DEVICE INCLUDING RESIN-INSULATED COPPER BASE PLATE AND MANUFACTURING METHOD OF SEMICONDUCTOR DEVICE

(71) Applicant: Mitsubishi Electric Corporation, Tokyo (JP)

(72) Inventor: Shotaro Sakumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/155,009

(22) Filed: Jan. 21, 2021

(65) Prior Publication Data

US 2021/0327779 A1   Oct. 21, 2021

(30) Foreign Application Priority Data

Apr. 17, 2020  (JP) .............................. JP2020-073835

(51) Int. Cl.

| | |
|---|---|
| *H01L 23/10* | (2006.01) |
| *H01L 23/14* | (2006.01) |
| *H01L 23/31* | (2006.01) |
| *H01L 23/00* | (2006.01) |
| *H01L 21/48* | (2006.01) |
| *H01L 23/492* | (2006.01) |

(52) U.S. Cl.
CPC ...... *H01L 23/3142* (2013.01); *H01L 21/4871* (2013.01); *H01L 23/4924* (2013.01); *H01L 24/45* (2013.01)

(58) Field of Classification Search
CPC ............. H01L 23/3142; H01L 21/4871; H01L 23/4924; H01L 24/45
USPC ................................. 257/773; 438/618, 666
See application file for complete search history.

(56) References Cited

U.S. PATENT DOCUMENTS

2016/0365298 A1 * 12/2016 Yamada ................. H01L 23/057
2019/0103334 A1 *  4/2019 Tanaka .................. H01L 23/293

FOREIGN PATENT DOCUMENTS

JP        2016096188 A      5/2016

* cited by examiner

*Primary Examiner* — Didarul A Mazumder
(74) *Attorney, Agent, or Firm* — Studebaker & Brackett PC

(57) ABSTRACT

An object is to provide a technique capable of suppressing insulation defects caused by the arrival of bubbles contained in an adhesive at a circuit pattern in a semiconductor device. A semiconductor device includes the resin-insulated copper base plate having the copper base plate, the insulating layer provided on the upper surface of the copper base plate, and the circuit pattern provided on the upper surface of the insulating layer, the semiconductor element mounted on the upper surface of the resin-insulated copper base plate, the case joined to the outer peripheral portion of the resin-insulated copper base plate via the adhesive, the sealing material sealing, in the case, the upper surface of the resin-insulated copper base plate and the semiconductor element, and the roughening patterns formed on the upper surface of the insulating layer such that the circuit pattern is enclosed therewith in a plan view.

11 Claims, 3 Drawing Sheets

F I G. 3
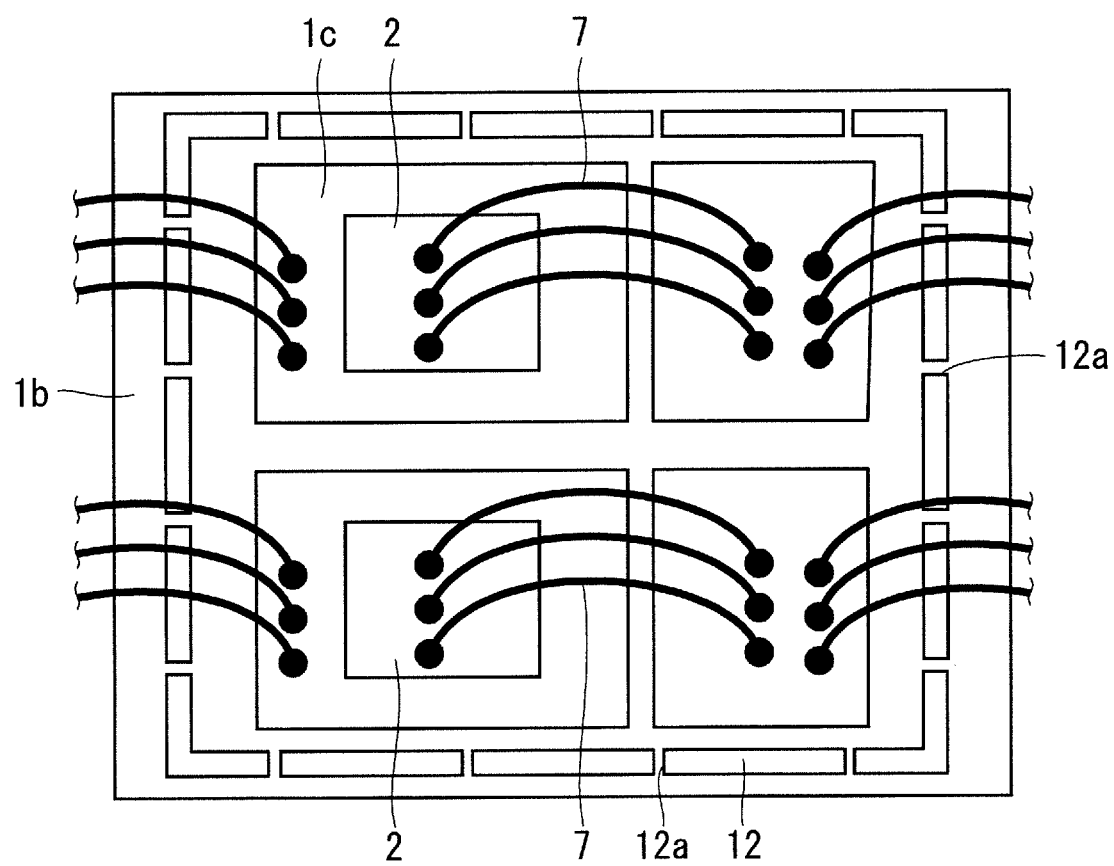

SEMICONDUCTOR DEVICE INCLUDING RESIN-INSULATED COPPER BASE PLATE AND MANUFACTURING METHOD OF SEMICONDUCTOR DEVICE

BACKGROUND OF THE INVENTION

Field of the Invention

The present disclosure relates to a semiconductor device including a resin-insulated copper base plate and a manufacturing method thereof.

Description of the Background Art

A semiconductor device including a resin-insulated copper base plate having a copper base plate, an insulating layer provided on the upper surface of the copper base plate, and a circuit pattern provided on the upper surface of the insulating layer, a semiconductor element, and a sealing material has been proposed. The semiconductor element is mounted on the upper surface of the resin-insulated copper base plate. A case is joined to the outer peripheral portion of the resin-insulated copper base plate via an adhesive. The sealing material seals the upper surface of the resin-insulated copper base plate and the semiconductor element inside the case (see, Japanese Patent Application Laid-Open No. 2016-096188).

SUMMARY

In recent years, cases are increasing in which a semiconductor element is operated at a high temperature. For example, an operating temperature of a semiconductor element using silicon (Si) as its base material is 175° C. A desirable operating temperature of a wide-gap semiconductor element using silicon carbide (SiC) and gallium nitride (GaN) as its base material is 200° C. Therefore, a glass transition temperature of a sealing material filled inside needs to surpass the operating temperature of the semiconductor element.

Further, as an adhesive for joining the case and the resin-insulated copper base plate, a resin having basically similar characteristics to the sealing material is used. Sealing materials and adhesives useable in such a high-temperature operation have high viscosity and poor fluidity; therefore, filling of a narrow gap between the case and the resin-insulated copper base plate, or in a distorted gap with such sealing materials and adhesives without an unfilled portion is difficult to execute.

When there is an unfilled portion in the adhesive, air is contained therein and becomes bubbles in many cases. Then, there has been a problem in that when the bubbles contained in the adhesive reach the circuit pattern, the insulation characteristics of the semiconductor device are deteriorated due to the generation of creeping discharge caused by the bubbles.

An object of the present disclosure is to provide a technique capable of suppressing insulation defects caused by the arrival of bubbles contained in an adhesive at a circuit pattern in a semiconductor device.

A semiconductor device according to the present disclosure includes a resin-insulated copper base plate, a semiconductor element, a case, a sealing material, and roughening patterns. The resin-insulated copper base plate includes a copper base plate, an insulating layer provided on an upper surface of the copper base plate, and a circuit pattern provided on an upper surface of the insulating layer. The semiconductor element is mounted on the upper surface of the resin-insulated copper base plate. The case is joined to the outer peripheral portion of the resin-insulated copper base plate via the adhesive. The sealing material seals, in the case, the upper surface of the resin-insulated copper base plate and the semiconductor element. The roughening patterns are formed on the upper surface of the insulating layer such that the circuit pattern is enclosed therewith in a plan view.

The surface area of the periphery of the circuit pattern on the upper surface of the insulating layer is increased with the roughening patterns; therefore, the adhesive containing the bubbles is suppressed from reaching the circuit pattern. Consequently, in the semiconductor device, insulation defects caused by the arrival of the bubbles at the circuit pattern are suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view of a resin-insulated copper base plate included in a semiconductor device according to Embodiment 3 and surroundings thereof.

DESCRIPTION OF THE PREFERRED EMBODIMENTS

Embodiment 1

Figure 1:
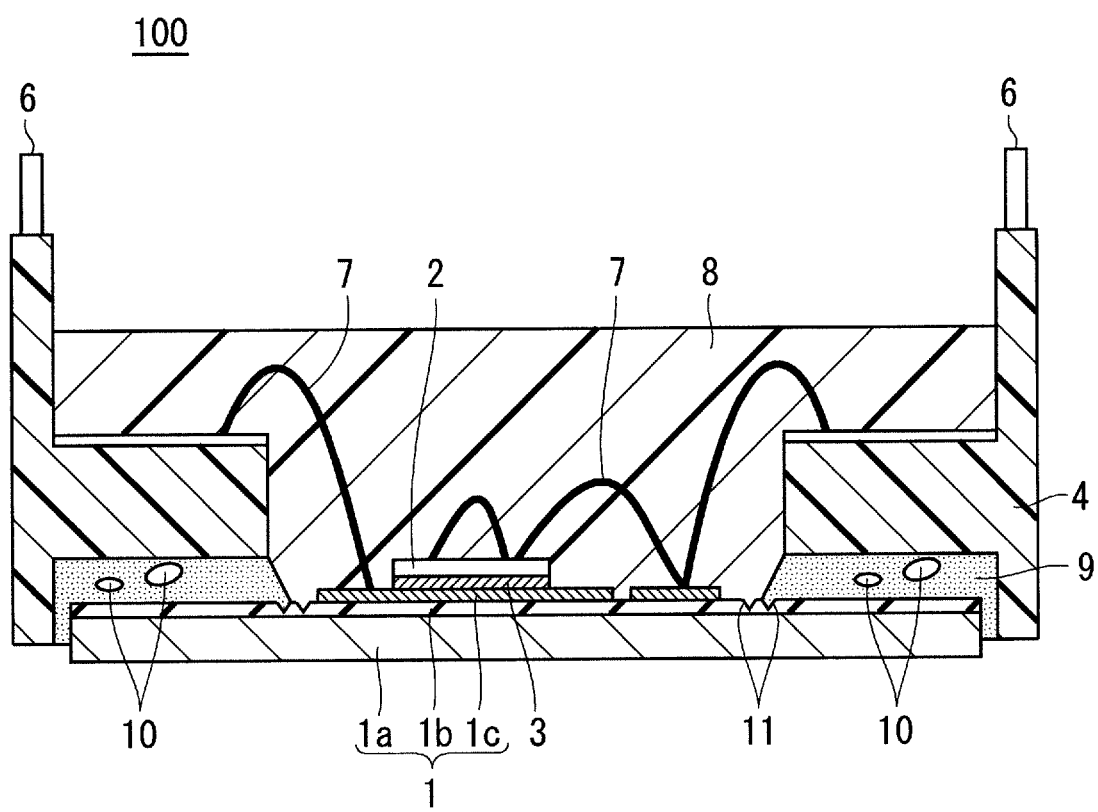
FIG. 1 is a cross-sectional view of a semiconductor device according to Embodiment 1.

Embodiment 1 will be described below with reference to the drawings. FIG. 1 is a cross-sectional view of a semiconductor device 100 according to Embodiment 1.

As illustrated in FIG. 1, the semiconductor device 100 includes a resin-insulated copper base plate 1, a semiconductor element 2, a case 4, an electrode terminal 6, a sealing material 8, and roughening patterns 11.

The resin-insulated copper base plate 1 includes a copper base plate 1a, an insulating layer 1b, and a circuit pattern 1c. The copper base plate 1a, the insulating layer 1b, and the circuit pattern 1c are integrated. The copper base plate 1a is formed in a rectangular shape in a plan view. The insulating layer 1b is provided across the entire upper surface of the copper base plate 1a. The insulating layer 1b is made of a resin and has a thickness of 0.2 mm. The circuit pattern 1c is provided on the upper surface of the insulating layer 1b except for the outer peripheral portion. The circuit pattern 1c is made of copper and has a thickness of 0.5 mm.

The semiconductor element 2 is mounted on the upper surface of the circuit pattern 1c via solder 3. The case 4 is formed in a rectangular frame shape in a plan view, and is joined to the outer peripheral portion of the resin-insulated copper base plate 1 via an adhesive 9. Further, the case 4 is made of a resin and has an insulating property. The electrode terminal 6 is provided in the case 4 and is connected to the circuit pattern 1c and the semiconductor element 2 via aluminum wires 7. The sealing material 8 is made of, for example, an epoxy resin, and is filled inside the case 4. As a result, the sealing material 8 seals, in the case 4, the upper surface of the resin-insulated copper base plate 1 and the semiconductor element 2.

Two roughening patterns 11 are formed on the upper surface of the insulating layer 1b such that the circuit pattern 1c is doubly enclosed therewith in a plan view. Each roughening pattern 11 is formed in a rectangular shape in a plan view. It should be noted that, the number of roughening patterns 11 is not limited to two and three or more roughening patterns 11 may be formed. Further, each roughening pattern 11 may be formed continuously or intermittently.

Each roughening pattern 11 is formed at a position on the upper surface of the insulating layer 1b at a distance of 500 μm or more from the end portion of the circuit pattern 1c. Further, each roughening pattern 11 has a width of 200 μm and a depth of ⅓ of the thickness of the insulating layer 1b.

Subsequently, a manufacturing method of the semiconductor device 100 will be described. First, the resin-insulated copper base plate 1 is manufactured. Here, only the formation of the characteristic portion of the resin-insulated copper base plate 1 will be described. In the manufacturing process of the resin-insulated copper base plate 1, after the circuit pattern 1c is formed on the upper surface of the insulating layer 1b, the insulating layer 1b is laser-processed or machined to form the roughening patterns 11.

Machining is, for example, polishing or cutting. Next, the semiconductor element 2 is joined to the upper surface of the resin-insulated copper base plate 1 with solder 3. Next, the adhesive 9 is applied to the outer peripheral portion of the resin-insulated copper base plate 1. In a state where the case 4 in which the electrode terminal 6 is inserted is fitted to the outer peripheral portion of the resin-insulated copper base plate 1, the temperature is raised to cure the adhesive 9 whereby the adhesion is completed. Next, when the internal wiring of the aluminum wires 7 is finished, filling of the epoxy resin served as the sealing material 8 is performed. The semiconductor device 100 is completed by raising the temperature of the semiconductor device 100 to cure the epoxy resin.

The size of the bubbles 10 contained in the adhesive 9 is, for example, 0.1 mm or more and 0.2 mm or less. Although the adhesive 9 containing the bubbles 10 tends to move from the lower side of the case 4 toward the circuit pattern 1c, the adhesive 9 containing the bubbles 10 is less likely to reach the circuit pattern 1c. This is because the surface area of the periphery of the circuit pattern 1c on the upper surface of the insulating film 1b is increased by the formation of the roughening patterns 11, that is, the path from the lower side of the case 4 to the circuit pattern 1s is extended.

As described above, the semiconductor device 100 according to Embodiment 1 includes the resin-insulated copper base plate 1 having the copper base plate 1a, the insulating layer 1b provided on the upper surface of the copper base plate 1a, and the circuit pattern 1c provided on the upper surface of the insulating layer 1b, the semiconductor element 2 mounted on the upper surface of the resin-insulated copper base plate 1, the case 4 joined to the outer peripheral portion of the resin-insulated copper base plate 1 via the adhesive 9, the sealing material 8 sealing, in the case 4, the upper surface of the resin-insulated copper base plate 1 and the semiconductor element 2, and the roughening patterns 11 formed on the upper surface of the insulating layer 1b such that the circuit pattern 1c is enclosed therewith in a plan view.

Accordingly, the surface area of the periphery of the circuit pattern 1c on the upper surface of the insulating layer 1b is increased with the roughening patterns 11; therefore, the path from the lower side of the case 4 to the circuit pattern 1c is extended, this suppresses the adhesive 9 containing the bubbles 10 from reaching the circuit pattern 1c. That is, the bubbles 10 are suppressed from reaching the circuit pattern 1c. Consequently, in the semiconductor device 100, insulation defects caused by the arrival of the bubbles 10 at the circuit pattern 1c are suppressed. This leads to long-term use of the semiconductor device 100.

Also, each roughening pattern 11 is formed at a position on the upper surface of the insulating layer 1b at a distance of 500 μm or more from the end portion of the circuit pattern 1c. Therefore, the inflow of the bubbles 10 within 500 μm from the end portion of the circuit pattern 1c on the upper surface of the insulating layer 1b is suppressed. As a result, the required insulation withstand voltage of 2500 V or more in the semiconductor device 100 is secured.

Also, each roughening pattern 11 has a width of 200 μm and a depth of ⅓ of the thickness of the insulating layer 1b. Therefore, the bubbles 10 contained in the adhesive 9 are trapped by the roughening patterns 11. Further, if the roughening patterns 11 extend through the insulating layer 1b and reach the copper base plate 1a, deterioration in the insulation characteristics of the semiconductor device 100 is concerned; however, no such a problem arises as the roughening patterns 11 has a depth of ⅓ of the thickness of the insulating layer 1b.

Further, in the manufacturing method of the semiconductor device according to Embodiment 1, after the circuit pattern 1c is formed, the roughening patterns 11 are formed by laser-processing or machining the insulating layer 1b; therefore, the roughening patters 11 are formed on the upper surface of the insulating layer 1b in a simple manner.

Embodiment 2

Figure 2:
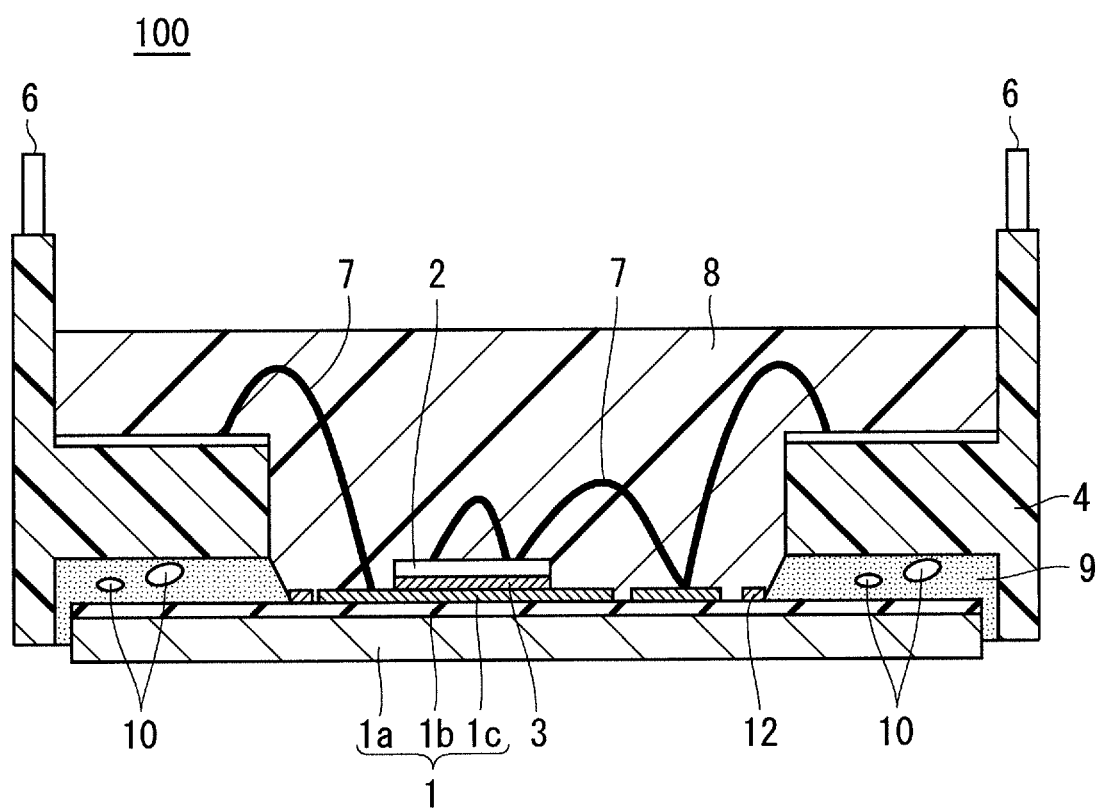
FIG. 2 is a cross-sectional view of a semiconductor device according to Embodiment 2.

Subsequently, a semiconductor device 100 according to Embodiment 2 will be described. FIG. 2 is a cross-sectional view of a semiconductor device 100 according to Embodiment 2. In Embodiment 2, the same components as those described in Embodiment 1 are designated by the same reference numerals, and the description thereof will be omitted.

As illustrated in FIG. 2, in Embodiment 2, the semiconductor device 100 includes a metal spacer 12 instead of the roughening patterns 11.

The metal spacer 12 is provided on the upper surface of the insulating layer 1b so as to continuously surround the circuit pattern 1c in a plan view. The metal spacer 12 is made of metal that adheres to the insulating layer 1b, and is formed in a rectangular shape in a plan view. Although the examples of the metals that adhere to the insulating layer 1b are copper, nickel, aluminum, and the like, copper is preferable considering that the spacer 12 is formed along with the circuit pattern 1c as described later. Subsequently, a method of manufacturing the semiconductor device according to Embodiment 2 will be described. Here, only Steps that differ from those of Embodiment 1 will be described. In the manufacturing process of the resin-insulated copper base plate 1, etching is performed when the circuit pattern 1c is formed on the upper surface of the insulating layer 1b, thereby forming the metal spacer 12 along with the circuit pattern 1c. Therefore, the thickness of the metal spacer 12 is 0.5 mm, which is the same as the thickness of the circuit pattern 1c. A slight difference between the thickness of the circuit pattern 1c and the thickness of the metal spacer 12 due to manufacturing errors and the like is allowable.

The metal spacer 12 is provided at a position on the upper surface of the insulating layer 1b at a distance of 500 μm or more from the end portion of the circuit pattern 1c. The metal spacer 12 has a width of 500 μm or more and 1.0 mm or less in order to block the adhesive 9 so that no adhesive 9 reaches the circuit pattern 1c.

As described above, the semiconductor device 100 according to Embodiment 2 includes the resin-insulated copper base plate 1 having the copper base plate 1a, the insulating layer 1b provided on the upper surface of the copper base plate 1a, and the circuit pattern 1c provided on the upper surface of the insulating layer 1b, the semiconductor element 2 mounted on the upper surface of the resin-insulated copper base plate 1, the case 4 joined to the outer peripheral portion of the resin-insulated copper base plate 1 via the adhesive 9, the sealing material 8 sealing, in the case 4, the upper surface of the resin-insulated copper base plate 1 and the semiconductor element 2, and the metal spacer 12 provided on the upper surface of the insulating layer 1b such that the circuit pattern 1c is enclosed therewith in a plan view.

Accordingly, the adhesive 9 is blocked by the metal spacer 12; therefore, the adhesive 9 containing the bubbles 10 is suppressed from reaching the circuit pattern 1c. That is, the bubbles 10 are suppressed from reaching the circuit pattern 1c. Consequently, in the semiconductor device 100, insulation defects caused by the arrival of the bubbles 10 at the circuit pattern 1c are suppressed. This leads to long-term use of the semiconductor device 100.

The metal spacer 12 is provided at a position on the upper surface of the insulating layer 1b at a distance of 500 μm or more from the end portion of the circuit pattern 1c. Therefore, the inflow of the bubbles 10 within 500 μm from the end portion of the circuit pattern 1c on the upper surface of the insulating layer 1b is suppressed. As a result, the required insulation withstand voltage of 2500 V or more in the semiconductor device 100 is secured.

Further, the metal spacer 12 has a width of 500 μm or more and 1.0 mm or less and the same thickness as that of the circuit pattern 1c. Therefore, the bubbles 10 contained in the adhesive 9 are effectively blocked by the metal spacer 12.

Further, in the method for manufacturing the semiconductor device according to Embodiment 2, the metal spacer 12 is formed by etching at the time of forming the circuit pattern 1c; therefore, the metal spacer 12 is formed along with the circuit pattern 1c. As a result, the metal spacer 12 is provided on the upper surface of the insulating layer 1b without additional new steps.

Embodiment 3

Subsequently, a semiconductor device 100 according to Embodiment 3 will be described. FIG. 3 is a plan view of a resin-insulated copper base plate 1 included in a semiconductor device according to Embodiment 3 and surroundings thereof. In Embodiment 3, the same components as those described in Embodiments 1 and 2 are designated by the same reference numerals, and the description thereof will be omitted.

In Embodiment 2, the metal spacer 12 is provided on the upper surface of the insulating layer 1b so as to continuously surround the circuit pattern 1c in a plan view. Meanwhile, in Embodiment 3, the metal spacer 12 is provided on the upper surface of the insulating layer 1b so as to intermittently surround the circuit pattern 1c, as illustrated in FIG. 3. Therefore, the metal spacer 12 is provided with gaps 12a at predetermined intervals.

In the case where the epoxy resin existing between the circuit pattern 1c and the metal spacer 12 contains the bubbles 10 before the epoxy resin to be the sealing material 8 is cured, the bubbles 10 are released to the outer peripheral side of the metal spacer 12 through the gaps 12a of the metal spacer 12. As a result, the bubbles 10 contained in the epoxy resin are kept away from the circuit pattern 1c. Here, a gap 12a is formed larger than the size of a bubble 10 so that the bubble 10 contained in the epoxy resin can pass therethrough.

As described above, in the semiconductor device 100 according to Embodiment 3, the metal spacer 12 is intermittently provided. Therefore, the bubbles 10 contained in the epoxy resin serving as the sealing material 8 are prevented from reaching the circuit pattern 1c. As a result, in addition to the effect of Embodiment 2, in the semiconductor device 100, insulation defects caused by the arrival of the bubbles 10 at the circuit pattern 1c are suppressed.

Embodiments can be arbitrarily combined and can be appropriately modified or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a resin-insulated copper base plate including a copper base plate, an insulating layer provided on an upper surface of the copper base plate, and a circuit pattern provided on an upper surface of the insulating layer;
   a semiconductor element mounted on an upper surface of the resin-insulated copper base plate;
   a case joined to an outer peripheral portion of the resin-insulated copper base plate via an adhesive;
   a sealing material, in the case, sealing the upper surface of the resin-insulated copper base plate, and the semiconductor element; and
   a roughening pattern formed on the upper surface of the insulating layer, wherein
   the circuit pattern is enclosed by the roughening pattern in a plan view.

2. The semiconductor device according to claim 1, wherein
   the roughening pattern is formed at a position on the upper surface of the insulating layer at a distance of 500 μm or more from an end portion of the circuit pattern.

3. The semiconductor device according to claim 1, wherein
   the roughening pattern has a width of 200 μm and a depth of ⅓ of a thickness of the insulating layer.

4. A manufacturing method of the semiconductor device according to claim 1, wherein
   after the circuit pattern is formed, the insulating layer is laser-processed or machined to form the roughening patterns.

5. A semiconductor device comprising:
   a resin-insulated copper base plate including a copper base plate, an insulating layer provided on an upper surface of the copper base plate, and a circuit pattern provided on an upper surface of the insulating layer;
   a semiconductor element mounted on an upper surface of the resin-insulated copper base plate;
   a case joined to an outer peripheral portion of the resin-insulated copper base plate via an adhesive;

a sealing material, in the case, sealing the upper surface of the resin-insulated copper base plate, and the semiconductor element; and a metal spacer provided on the upper surface of the insulating layer between the adhesive and an end portion of the circuit pattern, wherein the circuit pattern is enclosed by the metal spacer in a plan view, and the metal spacer blocks the adhesive from reaching the circuit pattern.

6. The semiconductor device according to claim 5, wherein the metal spacer has a width of 500 μm or more and 1.0 mm or less and a same thickness as that of the circuit pattern.

7. The semiconductor device according to claim 5, wherein the metal spacer is intermittently provided.

8. A manufacturing method of the semiconductor device according to claim 5, wherein the metal spacer is formed by etching performed when the circuit pattern is formed.

9. The semiconductor device according to claim 5, wherein the metal spacer is spaced inwardly from an inner periphery of the case.

10. A semiconductor device comprising:

a resin-insulated copper base plate including a copper base plate, an insulating layer provided on an upper surface of the copper base plate, and a circuit pattern provided on an upper surface of the insulating layer;

a semiconductor element mounted on an upper surface of the resin-insulated copper base plate;

a case joined to an outer peripheral portion of the resin-insulated copper base plate via an adhesive;

a sealing material, in the case, sealing the upper surface of the resin-insulated copper base plate and the semiconductor element; and a metal spacer provided on the upper surface of the insulating layer, wherein the circuit pattern is enclosed by the metal spacer in a plan view, and the metal spacer is provided at a position on the upper surface of the insulating layer at a distance of 500 μm or more from the end portion of the circuit pattern.

11. The semiconductor device according to claim 10, wherein the metal spacer is provided between the adhesive and an end portion of the circuit pattern, and the metal spacer blocks the adhesive from reaching the circuit pattern.

* * * * *